US006747303B2

United States Patent
Schroeder (12)

(10) Patent No.: US 6,747,303 B2
(45) Date of Patent: Jun. 8, 2004

(54) CHARGE DETECTOR SEMICONDUCTOR COMPONENT, SYSTEM COMPRISING A CHARGE DETECTOR SEMICONDUCTOR COMPONENT AND A REFERENCE SEMICONDUCTOR COMPONENT, WAFER, USE OF A WAFER, AND METHOD FOR THE QUALITATIVE AND QUANTITATIVE MEASUREMENT OF CHARGING OF A WAFER

(75) Inventor: Hans-Ulrich Schroeder, Quickborn (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/288,132

(22) Filed: Nov. 5, 2002

(65) Prior Publication Data

US 2003/0098706 A1 May 29, 2003

(30) Foreign Application Priority Data

Nov. 6, 2001 (DE) .......................................... 101 54 392

(51) Int. Cl.[7] ............................................... H01L 29/72
(52) U.S. Cl. ...................... 257/296; 257/297; 257/299; 257/302
(58) Field of Search .............................. 257/296, 297, 257/299, 302, 347, 355

(56) References Cited

U.S. PATENT DOCUMENTS 5,650,651 A * 7/1997 Bui ............................ 257/355

FOREIGN PATENT DOCUMENTS

| JP | 10284726 A | 10/1998 | .......... H01L/29/78 |
| WO | WO0060672 | 10/2000 | ......... H01L/29/788 |

* cited by examiner

Primary Examiner—Edward Wojciechowicz
(74) Attorney, Agent, or Firm—Aaron Waxler

(57) ABSTRACT

The invention relates to a charge detector semiconductor component in the form of a structure provided on a semiconductor material, which component comprises a non-volatile storage cell in the form of a MOS field effect transistor with a transistor gate and a MOS capacitor with a capacitor gate. The invention further relates to a system comprising a charge detector semiconductor component and a reference semiconductor component. The invention further relates to a wafer as well as to the use of a wafer with a plurality of charge detector semiconductor elements and/or systems. Finally, the invention relates to a method for the qualitative and quantitative measurement of the charging of a wafer during processing of the wafer. According to the invention, it is possible to measure exactly the charge that has arisen during the processing of wafers and the manufacture of semiconductor components, in particular owing to plasma and ion implantation processes. The process can be continuously monitored, and the structure can be manufactured in a standard CMOS technology.

24 Claims, 5 Drawing Sheets

CHARGE DETECTOR SEMICONDUCTOR COMPONENT, SYSTEM COMPRISING A CHARGE DETECTOR SEMICONDUCTOR COMPONENT AND A REFERENCE SEMICONDUCTOR COMPONENT, WAFER, USE OF A WAFER, AND METHOD FOR THE QUALITATIVE AND QUANTITATIVE MEASUREMENT OF CHARGING OF A WAFER

The invention relates to a charge detector semiconductor component in the form of a structure provided on a semiconductor material, which component comprises a non-volatile storage cell in the form of a MOS field effect transistor with a transistor gate and a MOS capacitor with a capacitor gate. The invention further relates to a system comprising a charge detector semiconductor component and a reference semiconductor component. The invention further relates to a wafer as well as to the use of a wafer with a number of charge detector semiconductor elements and/or systems. Finally, the invention relates to a method for the qualitative and quantitative measurement of charging of a wafer during processing of the wafer.

Wafer charging is a phenomenon that takes place continuously during the manufacture of semiconductor components, because many process steps take place in a plasma or are carried out by means of charged particles. In particular the thin gate oxides of MOS transistors in CMOS-type technologies, i.e. CMOS or BICMOS or similar technologies, can be destroyed by the charge collected on conductive surfaces, for example made of polycrystalline silicon or metal, during a process step and by the resulting tunnel current. This charging often is a cause of a low production yield.

It is attempted in product development to reduce the influence of the charging on the yield by means of so-called antenna rows.

During the process, test wafers are used, so-termed CHARM wafers (CHARging Monitors), in attempts to identify those process steps and pieces of equipment which cause particularly much charging and accordingly low yields.

Process monitoring by means of a CHARM wafer, however, is complicated and expensive, in particular because a production is to be interrupted for measuring one or several CHARM wafers.

JP-10-284726 describes a structure consisting of a p-channel and an n-channel MOS transistor and a method of measuring wafer charging in surroundings comprising a plasma. The structure requires a measurement before and after the plasma process step. This is only possible if the structure is contacted. This means that the monitoring of production goods having the structure can definitely be used for plasma steps at the end of a manufacturing process.

U.S. Pat. No. 5,959,309 describes a structure comprising an antenna, a diode string, a reverse-biased and a forward-biased transistor, and a storage capacitor for measuring wafer charging in surroundings comprising a plasma. A method in which the finished structure is placed in an instantaneous state in a plasma arrangement is also described therein. After completion of the plasma process, the end state is read out and compared with the original instantaneous state. A measure for charging in the step just carried out can be derived from the measured difference. An installation can be monitored by this method. The monitoring, however, cannot be carried out during the manufacture of useful material.

The methods of the two publications cited above have a number of disadvantages. Thus the expensive manufacturing installations are not operative during the monitoring of wafer charging. The production break causes considerable expense.

Furthermore, expensive test wafers such as those known, for example, as CHARM wafers, are required for monitoring.

Finally, the installation is checked at one particular moment only. The ongoing production, however, remains unchecked during this.

The structures described in JP-10-284726 and U.S. Pat. No. 5,959,309, furthermore, do not render possible a very accurate assessment of the charging. In particular, no analysis of any individual process step is possible.

Furthermore, the structures are not compatible with the CMOS manufacturing processes because they have no construction of the CMOS technology type and no circuits of the CMOS technology type, so that a number of process steps is necessary outside the CMOS technology standard. Thus it may be noted that the structure of JP 10-284726 is not compatible with the standard CMOS manufacturing method because it uses two polycrystalline silicon levels (4 and 3 in FIG. 3). The structure of U.S. Pat. No. 5,959,309 is not compatible with the standard CMOS manufacturing method because on the one hand it uses a high-quality capacitor (46 in FIGS. 4a and 4b) which would be manufactured with two superimposed polycrystalline silicon levels as a rule in a CMOS process. As a result, an additional polycrystalline silicon level becomes necessary again as compared with the standard CMOS process. On the other hand, the photodiode string (43 in FIG. 4a) requires the layers lying over the photodiode to be transparent. This, however, need not necessarily be the case in a standard CMOS process. Furthermore, a silicon semiconductor may not be capable of absorbing plasma radiation over the entire spectral range that occurs. An application of the structures described therein to production goods within the scope of a CMOS wafer processing is accordingly impossible.

A non-volatile storage cell is known from the publication "EEPROM-Struktur im CMOS-Technologie mit einer Polysiliciumebene" (EEPROM Structure in CMOS Technology with One Polycrystalline Silicon Level), Shaker Verlag, ISBN 3-8265-3289-9, Aachen 1998, and from WO 00/60672, which can be manufactured in a standard CMOS process. It is not suitable, however, for use as a monitor for wafer charging, i.e. as a wafer charging detector device.

It is an object of the present invention to provide a structure which is based on a non-volatile storage structure and which operates as a process control monitor (PCM) structure. It is a further object to indicate a use of the structure and a method whereby the charge can be measured which has arisen in a given location on a wafer during a process step, which structure was manufactured during the manufacture and/or processing of the wafer in a CMOS or BICMOS technology.

To achieve the object as regards the structure, the invention in a first embodiment is based on a charge detector semiconductor component in the form of a structure provided on a semiconductor material, which comprises a non-volatile storage cell in the form of a MOS field effect transistor with a transistor gate, and advantageously also a source and a drain, and a MOS capacitor with a capacitor gate, and advantageously also a source and a drain.

In such a charge detector semiconductor component, according to the invention, the following are provided:

an antenna which is in operational connection with the capacitor gate, wherein the capacitor gate is connected in a further operational connection to the transistor gate such that a charge arising on the antenna can be stored in the storage cell and can be retrieved upon demand, and wherein the structure is arranged in compatibility with the CMOS technology.

To achieve the object as regards the structure in a second embodiment, the invention offers the following:

a system comprising a charge detector semiconductor component and a reference semiconductor component, in the form of a structure provided on a semiconductor material, wherein the charge detector semiconductor component comprises a non-volatile detector storage cell in the form of a first MOS field effect transistor with a detector transistor gate, and preferably also a source and a drain, and a first MOS capacitor with a detector capacitor gate, and preferably also a source and a drain, and comprises an antenna which is connected to the detector capacitor gate via a first operational connection, wherein the detector capacitor gate is connected via a first operational connection, wherein the detector capacitor gate is connected to the detector transistor gate via a further first operational connection, and wherein the reference semiconductor component comprises a non-volatile reference storage cell in the form of a second MOS field effect transistor with a reference transistor gate, and preferably also a source and a drain, and a second MOS capacitor with a reference capacitor gate, and preferably also a source and a drain, and comprises a ground conductor which is connected to the reference capacitor gate via a second operational connection, while the reference capacitor gate is connected to the reference transistor gate via a further second operational connection.

The invention is here based on the recognition that it is possible to manufacture the structure in the first and the second embodiment in each and every CMOS/BICMOS standard process during the manufacture of the wafer. The structure accordingly has an arrangement in accordance with the CMOS technology, i.e. only those units are used in the structure which can also be manufactured in any CMOS/BICMOS standard process used. In particular, units such as NMOS and PMOS transistors are used. Such units are available in all CMOS processes. The above structure may thus be present on each and every production wafer without additional process steps being necessary.

Units requiring several polycrystalline silicon levels have been particularly avoided. A continuous monitoring of the charging effect in the ongoing manufacture is only possible with the PCM structure (process control monitor structure) suitable as described above, according to the recognition. Said PCM structure is capable of storing charge arising during the process implementation in a non-volatile manner. Accordingly, said PCM structure uses a non-volatile storage cell. Additional process steps are usually necessary for the manufacture of non-volatile storage cells, so that the implementation in a standard CMOS or BICMOS technology or a similar technology has not been possible until now. Additional process steps or a change in the process sequence for the manufacture of the structure in a standard CMOS process, however, is not necessary in the above PCM structure in accordance with the recognition of the invention.

Only in this way is a monitoring of the production goods safeguarded, in particular in the processing of the wafer. The structure can thus be manufactured without additional expense on the one hand, while on the other hand it offers the only possibility of monitoring production goods during processing of the wafer without delaying the production sequence. In particular, the production goods can be continuously monitored in a cost-effective manner, and a continuous assessment of the charging can be carried out. In particular, expensive test wafers are avoided.

Further advantageous modifications of the invention as regards the structure in its first and second embodiment can be found in the dependent claims.

Preferably, a charge detector semiconductor component and/or a reference semiconductor component comprises a first region with the MOS field effect transistor and a first well, and a second region with the MOS capacitor and a second well, said first well and second well being doped with different signs. Favorably, the first well is a p-well and the second well an n-well. In particular, the MOS field effect transistor is an NMOS field effect transistor, and the MOS capacitor is a layered polycrystalline silicon/n-well capacitor.

In a further modification of the invention, the antenna, the capacitor gate, and the transistor gate are conductively interconnected, in particular connected with direct-contact conduction.

Advantageously, a control gate is formed by a well or by the source/drain contacts of the capacitor. This has the additional advantage that the storage cell can be read out in a particularly favorable manner.

Advantageously, furthermore, the transistor gate and the capacitor gate are each constructed as a polycrystalline silicon plate.

In particular, the structure of the first and of the second embodiment is arranged such that the semiconductor material is arranged in a first level, upon which the non-volatile storage cell is provided in a second level, on which second level the connections, the transistor gate, the capacitor gate, and the antenna or ground conductor are provided in a third level. It is found to be particularly favorable here that the transistor gate and the capacitor gate are jointly connected in one polycrystalline silicon level.

A construction in accordance with one of these modifications has the advantage that a manufacturing process for the structure is compatible with the CMOS-type manufacturing processes, in particular the standard CMOS process.

To achieve that the antenna dominates over the capacitor gate of the detector, advantageously, the surface area of the antenna is greater than the surface area of the polycrystalline silicon plate.

In a further series of modifications of the invention, the antenna may advantageously be implemented so as to be compatible with a standard CMOS technology. The antenna may be implemented as a polycrystalline silicon layer. In the CMOS-compatible implementation, the antenna is advantageously constructed in a single polycrystalline silicon layer. Alternatively, the antenna may be made of metal. In particular, the antenna may also be constructed as a contact antenna, in particular a via antenna. In another modification, the antenna is advantageously constructed as a MOS capacitor, in particular as an NMOS capacitor. It is safeguarded thereby that all levels in which charging can occur are monitored.

The invention further relates to a wafer in which the above characteristics of the embodiment of the invention can be realized. To achieve the object as regards the wafer, the invention provides a wafer, for example a silicon wafer, which, according to the invention, is fitted with a number of charge detector semiconductor components of the kind mentioned above and/or systems of the kind mentioned above. Advantageously, this is a production wafer, i.e. not a test wafer, on which the above structure is processed jointly with the production goods. The structure mentioned above may indeed have been manufactured already on the production wafer. In either case, the manufacture or processing takes place in a CMOS-type technology. This has the advantage that the structure is present on each production wafer. Preferably, the structure mentioned above is accommodated in a sawing lane of the wafer, which advantageously makes an effective use of the available space on the wafer. Processing of the production goods, in fact, takes place on the remaining region of the wafer. In a further embodiment of the invention, the above structure is manufactured and/or processed in accordance with a given area distribution on the wafer. This renders possible a measurement of charging which is subdivided as to areas and/or selective as to process steps.

To achieve the object as regards the use, according to the invention, a use of a wafer of the kind mentioned above with a plurality of charge detector semiconductor elements of the kind mentioned above and/or systems of the kind mentioned above for the qualitative and quantitative measurement of a charging, in particular plasma-induced charging, of the wafer during processing of the wafer is provided. In a further embodiment of the invention, a given area distribution of said plurality is provided for the measurement of a charging, in particular a plasma-induced charging, of the wafer during processing of the wafer, which measurement is subdivided as to areas and/or selective as to process steps.

The object of the invention is achieved as regards the method by means of a method for the qualitative and quantitative measurement of a charging, in particular a plasma-induced charging, of a wafer during processing of the wafer, wherein the wafer is manufactured with the use of a CMOS-type technology, the wafer is provided with a system comprising a charge detector semiconductor component and a reference semiconductor component during its manufacture, which charge detector semiconductor component comprises a non-volatile detector storage cell in the form of a first MOS field effect transistor with a detector transistor gate, and advantageously also a source and a drain, and a first MOS capacitor with a detector capacitor gate, and advantageously also a source and a drain, and comprises an antenna which is connected to the detector capacitor gate by means of a first operational connection, wherein the detector capacitor gate is connected to the detector transistor gate by means of a further first operational connection, and wherein the reference semiconductor component comprises a non-volatile reference storage cell in the form of a second MOS field effect transistor with a reference transistor gate, and advantageously also a source and a drain, and a second MOS capacitor with a reference capacitor gate, and advantageously also a source and a drain, and a ground conductor which is connected to the reference capacitor gate by means of a second operational connection, while the reference capacitor gate is connected to the reference transistor gate by means of a further second operational connection, and the structure is arranged in accordance with a CMOS technology, such that during processing the detector capacitor gate is charged via the antenna, and the reference capacitor gate is possibly charged, and the reference capacitor gate is discharged via the ground conductor, and the charging of the detector capacitor gate is compared with the charging of the reference capacitor gate by means of a measurement.

Advantageously, the wafer is manufactured with a number of defined, locally distributed systems.

Further advantageous embodiments of the invention as regards the method are defined in the dependent claims.

In a further embodiment of the invention, the threshold voltage of the charge detector semiconductor component is compared with the threshold voltage of the reference semiconductor component for the measurement.

Alternatively, the drain currents may be compared while the control gate potentials applied to the charge detector component and the reference semiconductor component are the same. In such a case, in particular, the control gate potentials are formed by a well or by the respective source/drain connections of the capacitor of the detector semiconductor component and the reference semiconductor component.

Embodiments of the invention will be explained below with reference to the drawing. The latter does not show the embodiments true to scale; instead, the drawing is made in diagrammatic and/or slightly exaggerated form for greater clarity. Reference is made to the relevant prior art for supplementing the teachings that arise directly from the drawing. Identical elements have been given the same reference symbols. In the drawing.

Figure 1:
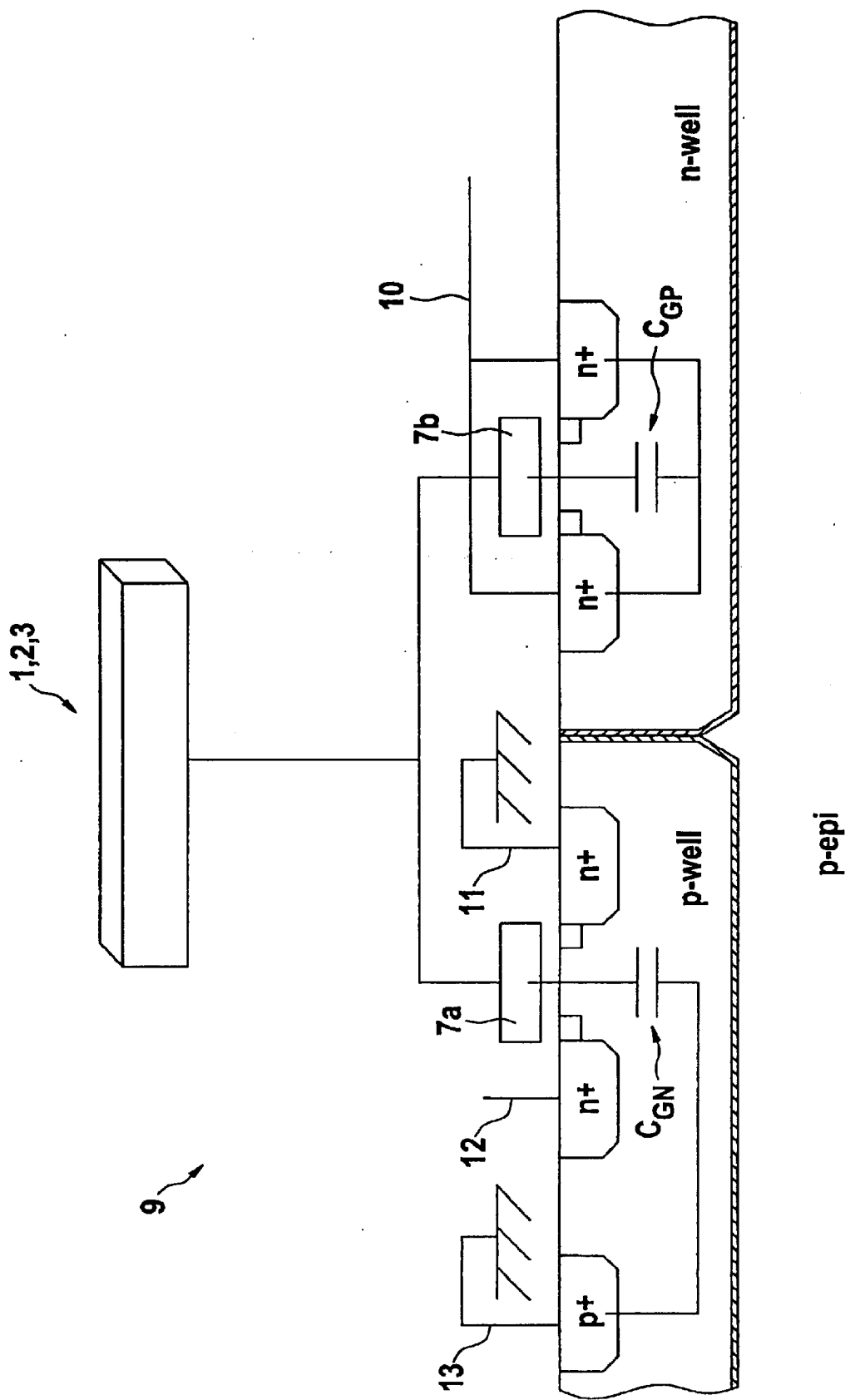
FIG. 1 is a cross-sectional view of a preferred embodiment of the charge detector semiconductor component, i.e. a wafer charging detector device.

In the wafer charging detector device 9 of FIG. 1, the non-volatile storage cell consists of an NMOS transistor and a layered polycrystalline silicon/n-well capacitor. The $n^+$ diffusion regions of the poly/n-well capacitor may be replaced with $p^+$ diffusion regions, if so desired. The gate of the NMOS transistor 7a and a polycrystalline silicon plate of the layered poly/n-well capacitor 7b are interconnected by direct contact in one polycrystalline silicon level. Furthermore, the antenna 1, 2, or 3 is directly connected to the polycrystalline silicon plate, the latter forming part of the capacitor gate 7b. This unit has the function of a floating gate 7. To achieve that the floating gate 7 (capacitor gate) is dominated by the antenna 1, 2, 3, the surface area of the antenna 1, 2, 3 is at least larger than that of the polycrystalline silicon plate. The control gate 10 is formed by the n-well of the capacitor, i.e. the $n^+$-terminals of the layered polycrystalline silicon/n-well capacitor. The drain connection 12 of the NMOS transistor is the read connection of the wafer charging detector device. 11 denotes the source, 12 the drain, and 13 the p-subterminal of the p-well of the NMOS transistor. The source connection 12 forms the write connection 12 (bit line).

The antenna 1, 2, 3 is connected to the capacitor gate 7 with direct electrical contact. The gate capacitances $C_{GP}$ and $C_{GN}$ are also diagrammatically indicated with symbols.

A graphical overview of possible antennas and their realization can be given as follows:

| Antenna: | |
|---|---|
| NMOST PMOST Bipolar implant | PS or PSS, covered plate SN, SP, or bipolar implantation mask |
| PSS | |
| Co COS | CO or COS covered with PS, IN, or INS |
| IN INS | simple plate |

Figure 2:
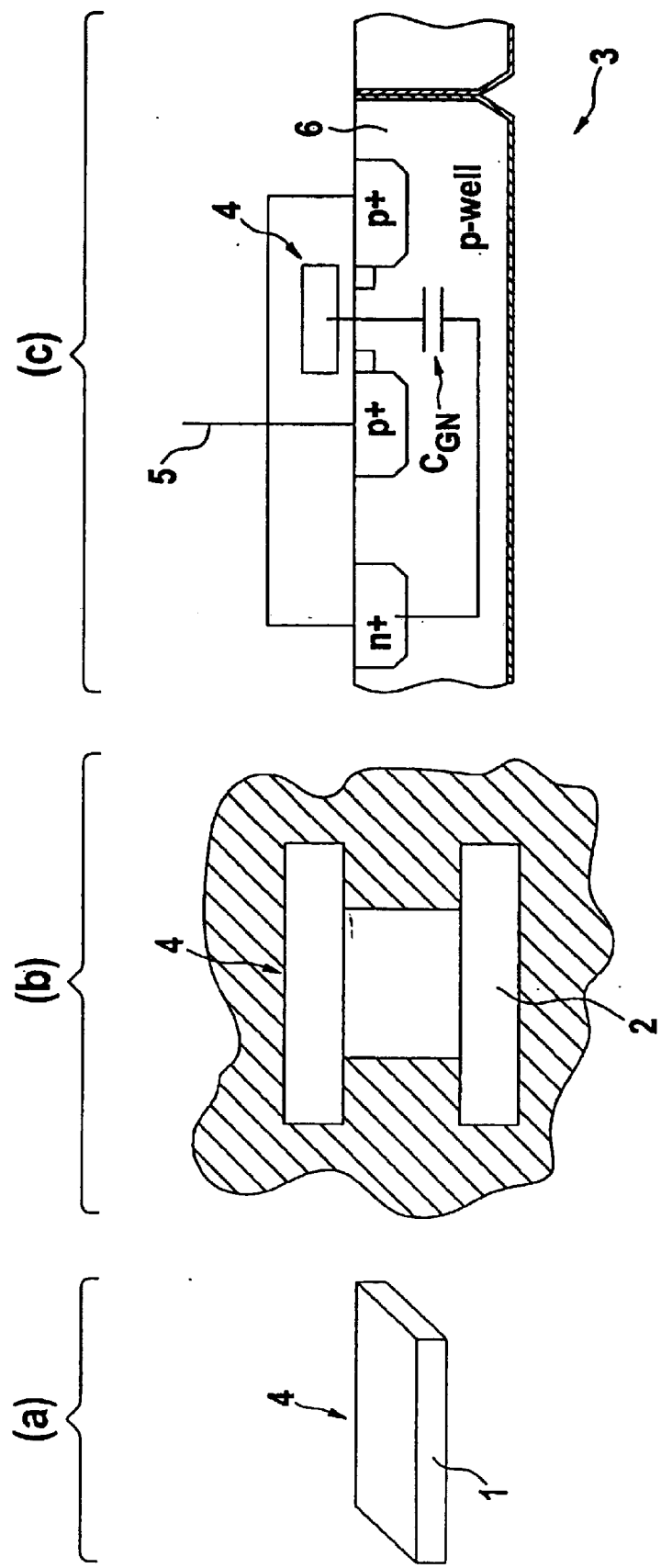
FIG. 2 shows possible antennas a), b), and c) of the wafer charging detector devices of FIG. 1.

The possible antennas are shown in detail in FIG. 2. The possible antennas are (a) a polycrystalline silicon or metal plate, (b) a contact or a via, and (c) a MOS capacitor.

In FIG. 2(*a*), an antenna may be constructed as a polycrystalline silicon or metal plate. It may be designed, for example, as an interconnect antenna with a first metallization level (IN) and a second metallization level (INS), i.e. as an IN or INS antenna.

In FIG. 2(*b*), the antenna 2 may be designed as a contact or a via or several contacts or vias, i.e. for example, as a contact-(CO) or a further contact-(COS) structure with a covering layer made of polycrystalline silicon (PS), a first metallization structure (IN), or a second metallization structure (INS).

In FIG. 2(*c*), an antenna 3 may be constructed as a MOS structure, for example as a MOS capacitor, an NMOS transistor, a PMOS transistor, a bipolar implant antenna, or a further polycrystalline silicon (PSS) structure. In particular, a PS or PSS plate, i.e. comprising a first polycrystalline silicon (PS) or a second polycrystalline silicon (PSS) level with a covering layer of a shallow $n^+$-(SN) or shallow $p^+$-(SP) structure, or a bipolar implant mask is possible for this.

The MOS capacitor is an antenna for implants. An implant antenna, however, is also provided by the polycrystalline silicon plate if the latter is implanted.

$C_{GN}$ is the NMOST gate capacitance. In all three cases, 4 is connected to the floating gate. In FIG. 2(*c*), 5 is connected to the control gate. 6 denotes an n-well.

Figure 3:
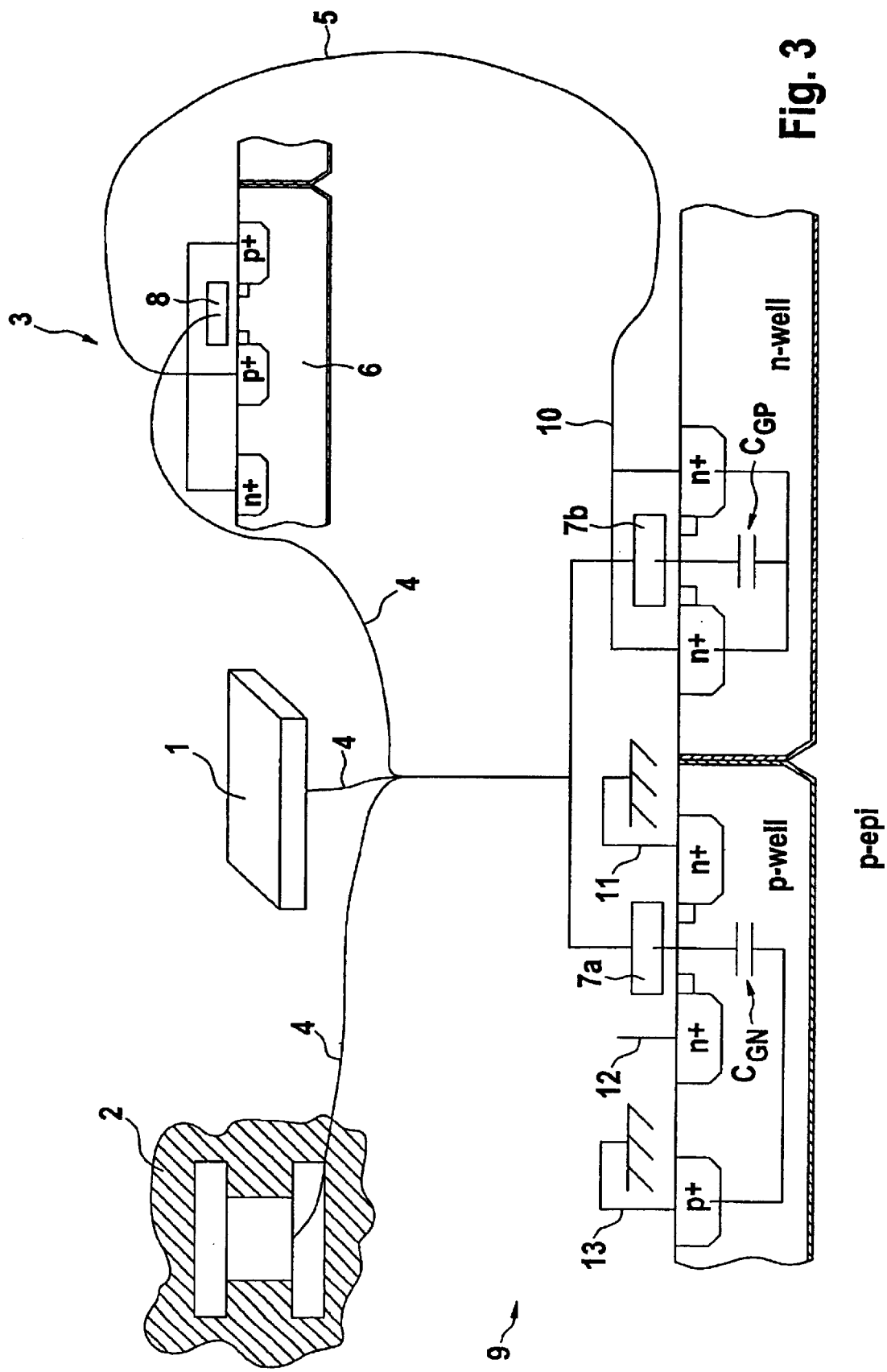
FIG. 3 is a cross-sectional view of the wafer charging detector device of FIG. 1 with possible connections for the antennas of FIG. 2.

FIG. 3 shows the complete wafer charging detector device 9 with the contacting of the various antennas 1, 2, and 3 of FIG. 2. As for FIG. 2(*a*) and FIG. 2(*b*), the antenna 1 or 2 is connected to the floating gate 7 of the polycrystalline silicon/n-well capacitor via 4. In FIG. 2(*c*), the antenna is constructed as a PMOS transistor. The gate of the antenna 3 is connected to the floating gate 7 of the polycrystalline silicon/n-well capacitor via 4, and the control gate of the antenna is connected to the control gate 10 of the polycrystalline silicon/n-well capacitor via 5.

The function of the wafer charging detector device will be described below.

Since many process steps in the manufacture of semiconductor components take place in a plasma or by means of charged particles, an electric charge accumulates on the floating antenna 1, 2, or 3 during production. The quantity of charge that accumulates depends on how much charge arises during the process steps for the manufacture of the antenna 1, 2, or 3. The charge cannot drain away from the isolated antenna 1, 2, or 3 and is stored.

To read out the charge stored on the antenna 1, 2, or 3, a positive read voltage is applied to the control gate 10. The substrate terminal 13 is at ground potential. As a result, the read voltage applies itself approximately to the gate capacitors $C_{GP}$ and $C_{GN}$ connected in series. When the read voltage is applied to 10, the capacitor gate potential $V_{FG}$ is dependent on the relationships between the gate capacitors $C_{GP}$, $C_{GN}$, the capacitance of the antenna 1, 2, or 3 ($C_{Antenna}$), and the charge $Q^{Antenna}$ on the antenna 1, 2, or 3 or the capacitor gate.

$$V_{FG} \approx V_{FG}^{Referenz} + \frac{1}{C_{ges}^{Antenna}} Q^{Antenna} \quad (1)$$

If the potential applied to the capacitor gate is greater than the threshold voltage of the NMOS transistor, an inversion layer will be formed below the gate between the source and drain diffusions of the NMOS transistor. The NMOS transistor of the wafer charging detector device is accordingly switched on. A current flow can be detected at the drain when the drain voltage is applied.

If the antenna 1, 2, or 3 is negatively charged during production, however, the negative charge will lead to an accumulation of positive charge carriers between the source and drain diffusions of the wafer charging detector device. The same read voltage applied will then no longer suffice for forming an inversion layer. The NMOS transistor is accordingly blocked. No current flow can be detected anymore at the drain terminal when a drain voltage is applied.

If the antenna 1, 2, or 3 is positively charged during production, on the other hand, the positive charge will lead to an inversion layer between the source and drain diffusions of the wafer charging detector device. The NMOS transistor will be switched on without the application of a read voltage. A current flow can be detected at the drain terminal when a drain voltage is applied.

The detected current of the wafer charging detector device 9 can be expressed by the following equation in all cases:

$$I_{DS} = \mu \frac{W}{L} C_{GN} \left[ (V_{FG} - V_T) V_{DS} - \frac{V_{DS}^2}{2} \right] \quad (2)$$

Figure 4:
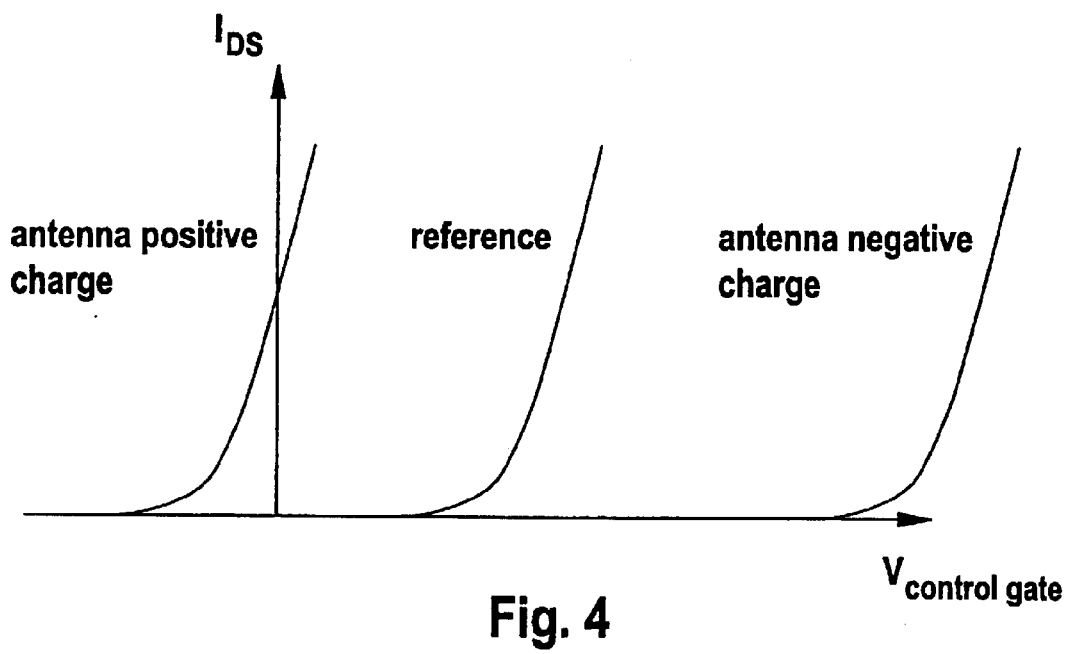
FIG. 4 shows charge states of the wafer charging detector device in the form of a control curve.

The three possible charge states: "antenna positively charged", "reference", and "antenna negatively charged" of the wafer charging detector device are shown in FIG. 4 by way of example by means of the characteristic curves in accordance with equation (2).

The evaluation of the wafer charging detector device 9 will be described in more detail below for a preferred embodiment of the method.

Figure 5:
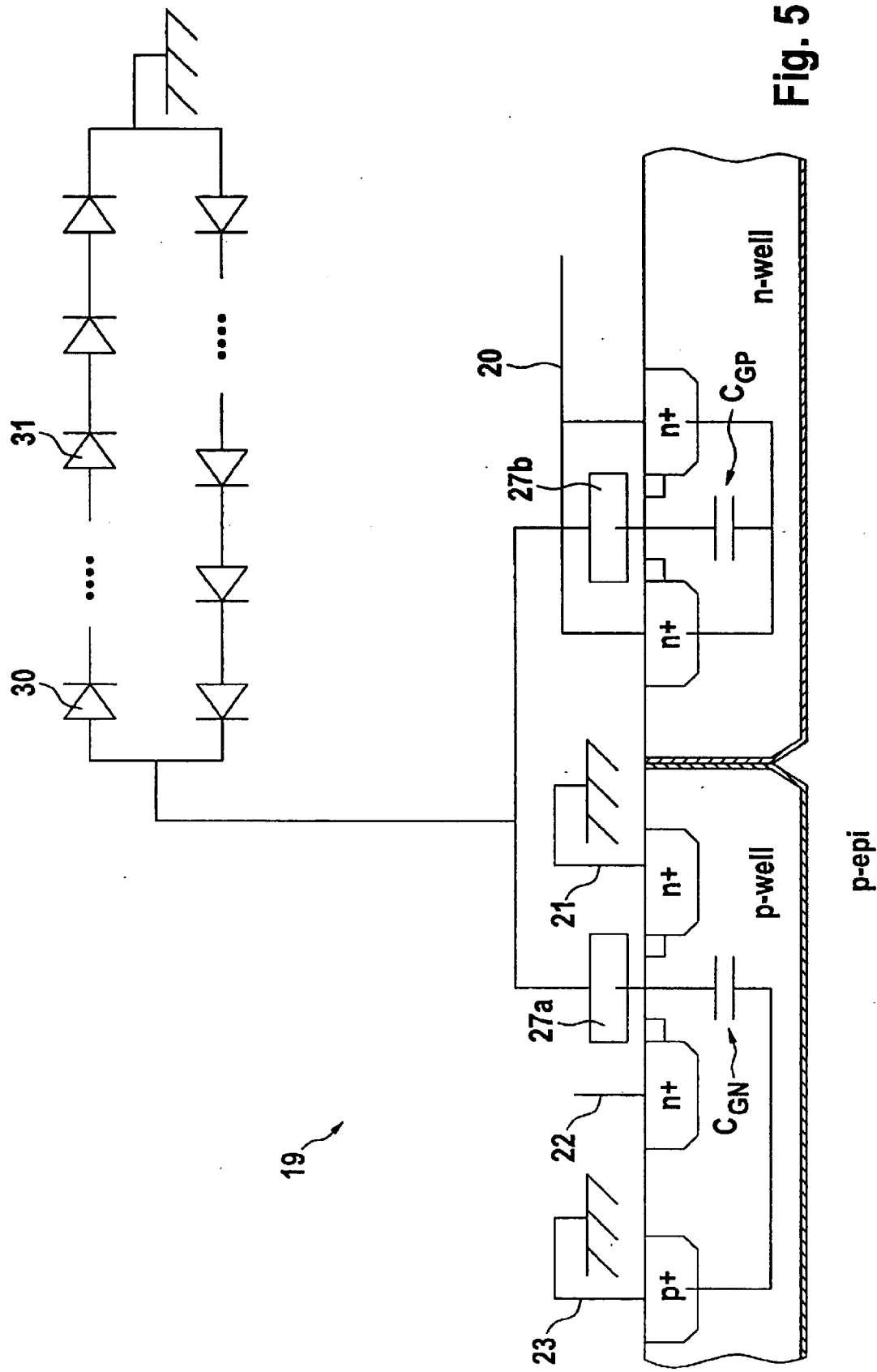
FIG. 5 is a cross-sectional view of a preferred embodiment of a reference semiconductor component, i.e. a reference structure of the wafer charging detector device for use in a preferred embodiment of the system.

The charge that has arisen on the wafer charging detector device 9 during a process step can be evaluated during the process control monitor (PCM) measurement through a comparison with a reference structure 19 shown in FIG. 5 of the wafer charging detector device shown in FIG. 1. The reference structure is basically constructed in the same manner as the wafer charging detector device, but it must be avoided here that the capacitor gate 27 can store charge which has arisen during processing. This may be achieved by means of a diode 30 or a diode stack 31. No charge can be stored on the capacitor gate 27 anymore then, because this charge will be drained off as a leakage current through the diodes 30, 31.

Correspondingly, 21 denotes the source connection, 22 the drain connection, and 23 the p-subconnection of the p-well of the reference structure. The source connection 12 forms the write connection 12 (bit line). The control gate 20 forms the read connection (word line) in the n-well.

The charge that has arisen during the manufacture of the relevant antennas 1, 2, or 3 can be determined through a comparison of the drain currents for the same control gate potentials applied to the reference structure 19 and to the wafer charging detector device 9 by means of equations (1) and (2).

Figure 6:
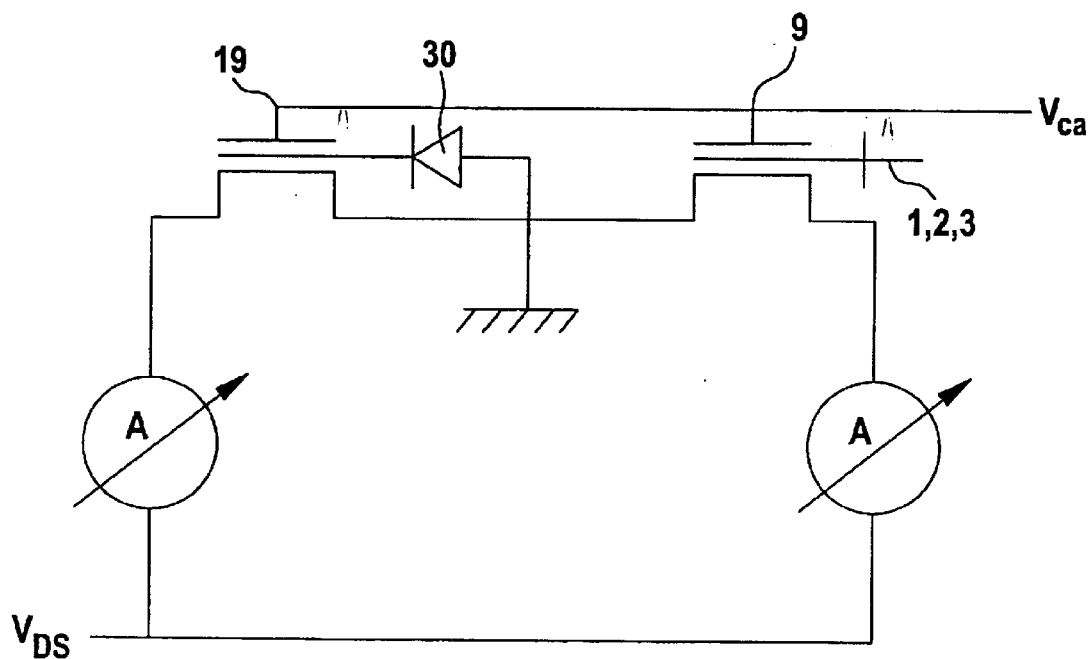
FIG. 6 shows evaluation methods of the wafer charging detector device through a comparative measurement with a reference structure in accordance with FIG. 5.

An example of a circuit for the reference measurement of the drain current is shown in FIG. 6.

A further possibility for determining the charge that has arisen through wafer charging during a given process step is the measurement of the threshold value of the wafer charging detector device and a comparison with the reference structure. For this purpose, the characteristic control gradient (similar to, for example, the one shown in FIG. 4) must be traversed through a continuous raising of the control gate potential $V_{Control}$ gate while the drain voltage $V_{DS}$ is applied. Subsequently, the charge may be calculated by means of equation (3) below:

$$Q_{Antenne} = C_{ges}(V_{th}^{Referenz} - V_{th}^{Antenne}) \quad (3)$$

Provided that the wafer charging detector device 9 used is a PCM structure with several antennas 1, 2 or 3, the influence of the wafer charging on each wafer from each batch can be ascertained at a given location on a wafer. This renders possible a continuous process monitoring as regards wafer charging during manufacture. The equipment or the process step leading to wafer charging can be immediately identified in an inexpensive manner.

The abbreviations used in the description and the Figures are explained in the legend below:

| | |
|---|---|
| MOS | metal oxide semiconductor |
| CMOS | complementary metal oxide semiconductor |
| BICMOS | bipolar and complementary metal oxide semiconductor |
| PCM | process control monitor |
| well | well |
| poly | polycrystalline silicon |
| N+ | strongly doped n-type diffusion |
| P+ | strongly doped p-type diffusion |
| $C_{GP}$ | gate capacitance of the control gate |
| $C_{GN}$ | NMOST gate capacitance |
| via | contact structure between two metallization levels |
| IN | first metallization level |
| INS | second metallization level |
| CO | contact structure between silicon material or polycrystalline silicon and first metallization level |
| COS | contact structure between first and second metallization levels |
| PS | polycrystalline silicon (first level) |
| PSS | polycrystalline silicon (second level) |
| SN | shallow n+, strongly doped, and planar n-type diffusion region, for example source/drain region |
| SP | shallow p+, strongly doped, and planar p-type diffusion region, for example source/drain region |
| $V_{FG}$ | floating gate potential |
| $C_{Antenna}$ | capacitance between antenna and semiconductor material |
| $Q^{Antenna}$ | electric charge on the antenna |
| $V_T$ | threshold voltage |
| $V_{TH}$ | threshold voltage |
| $I_{ds}$ | drain/source current |
| $\mu$ | movability of the charge carriers |
| W | transistor channel width |
| L | transistor channel length |
| $V_{DS}$ | drain/source voltage |

What is claimed is:

1. A charge detector semiconductor component in the form of a structure provided on a semiconductor material, which component comprises a non-volatile storage cell in the form of a MOS field effect transistor with a transistor gate and a MOS capacitor with a capacitor gate, and which is characterized by an antenna which is in operational connection with the capacitor gate, wherein the capacitor gate is connected in a further operational connection to the transistor gate such that a charge arising on the antenna can be stored in the storage cell and can be retrieved upon demand, and wherein the structure is arranged in compatibility with the CMOS technology.

2. A charge detector semiconductor component as claimed in claim 1, characterized by a first region with the MOS field effect transistor and a first well, and a second region with the MOS capacitor and a second well, said first well and second well being doped with different dopants.

3. A charge detector semiconductor component as claimed in claim 1, characterized in that the antenna, the capacitor gate, and the transistor gate are conductively interconnected.

4. A charge detector semiconductor component as claimed in claim 1, characterized in that the MOS field effect transistor is an NMOS field effect transistor.

5. A charge detector semiconductor component as claimed in claim 1, characterized in that the MOS capacitor is a layered polycrystalline silicon/n-well capacitor.

6. A charge detector semiconductor component as claimed in claim 1, characterized in that a control gate is formed by a well or by the source/drain contacts of the capacitor.

7. A charge detector semiconductor component as claimed in claim 1, characterized in that the transistor gate and the capacitor gate are each constructed as a polycrystalline silicon plate.

8. A charge detector semiconductor component as claimed in claim 7, characterized in that the surface area of the antenna is greater than the surface area of the polycrystalline silicon plate.

9. A charge detector semiconductor component as claimed in claim 1, characterized in that the antenna is constructed as a polycrystalline silicon layer.

10. A charge detector semiconductor component as claimed in claim 1, characterized in that the antenna is made of metal.

11. A charge detector semiconductor component as claimed in claim 1, characterized in that the antenna is constructed as a contact antenna.

12. A charge detector semiconductor component as claimed in claim 1, characterized in that the antenna is constructed as a MOS capacitor.

13. A charge detector semiconductor component as claimed in claim 1, characterized in that the semiconductor material is arranged in a first level, upon which the non-volatile storage cell is provided in a second level, on which second level the connections, the transistor gate, the capacitor gate, and the antenna or ground conductor are provided in a third level.

14. A charge detector semiconductor component as claimed in claim 1, characterized in that the transistor gate and the capacitor gate are jointly connected in one polycrystalline silicon level.

15. A system comprising a charge detector semiconductor component and a reference semiconductor component in the form of a structure provided on a semiconductor material, wherein the charge detector semiconductor component comprises a non-volatile detector storage cell in the form of a first MOS field effect transistor with a detector transistor gate, and a first MOS capacitor with a detector capacitor gate, and comprises an antenna which is connected to the detector capacitor gate via a first operational connection, and wherein the detector capacitor gate is connected to the detector transistor gate via a further first operational connection, and wherein the reference semiconductor component comprises a non-volatile reference storage cell in the form of a second MOS field effect transistor with a reference transistor gate, and a second MOS capacitor with a reference capacitor gate, and comprises a ground conductor which is connected to the reference capacitor gate via a second operational connection, while the reference capacitor gate is connected to the reference transistor gate via a further second operational connection, and wherein the structure is arranged in compatibility with the CMOS technology.

16. A wafer, comprising a plurality of charge detector semiconductor components as claimed in claim 1.

17. A wafer as claimed in claim 16, characterized in that the charge detector semiconductor components are located in a sawing lane of the wafer.

18. The use of a wafer comprising a plurality of charge detector semiconductor components as claimed in claim 1 for the qualitative and quantitative measurement of a charging of the wafer during processing of the wafer.

19. The use of a wafer as claimed in claim 18, characterized in that a predefined localized distribution of said plurality of charge detector semiconductor components is provided for the measurement of the charging of the wafer during processing of the wafer.

20. A method for the qualitative and quantitative measurement of a charging of a wafer during processing of the wafer, wherein the wafer is manufactured with the use of a CMOS-type technology, the wafer is provided with a system comprising a charge detector semiconductor component and a reference semiconductor component during its manufacture, which charge detector semiconductor component comprises a non-volatile detector storage cell in the form of a first MOS field effect transistor with a detector transistor gate, and a first MOS capacitor with a detector capacitor gate, and comprises an antenna which is connected to the detector capacitor gate by means of a first operational connection, wherein the detector capacitor gate is connected to the detector transistor gate by means of a further first operational connection, and wherein the reference semiconductor component comprises a non-volatile reference storage cell in the form of a second MOS field effect transistor with a reference transistor gate, and a second MOS capacitor with a reference capacitor gate, and a ground conductor which is connected to the reference capacitor gate by means of a second operational connection, while the reference capacitor gate is connected to the reference transistor gate by means of a further second operational connection, and the structure is arranged in accordance with a CMOS technology such that during processing the detector capacitor gate is charged via the antenna, and the reference capacitor gate is possibly charged, and the reference capacitor gate is discharged via the ground conductor, and the charging of the detector capacitor gate is compared with the charging of the reference capacitor gate by means of a measurement.

21. A method as claimed in claim 20, characterized in that the wafer is manufactured with a plurality of defined, locally distributed systems.

22. A method as claimed in claim 20, characterized in that the threshold voltage of the charge detector semiconductor component is compared with the threshold voltage of the reference semiconductor component for the measurement.

23. A method as claimed in claim 20, characterized in that, for the measurement, the drain currents of the charge detector component and of the reference semiconductor component are compared while the control gate potentials applied thereto are the same.

24. A method as claimed in claim 23, characterized in that the control gate potentials are formed by a well or by the respective source/drain connections of the capacitor of the detector semiconductor component and the reference semiconductor component.

* * * * *